United States Patent
Tamai et al.

(10) Patent No.: US 9,580,818 B2
(45) Date of Patent: Feb. 28, 2017

(54) ETCHING LIQUID FOR FILM OF MULTILAYER STRUCTURE CONTAINING COPPER LAYER AND MOLYBDENUM LAYER

(75) Inventors: Satoshi Tamai, Tokyo (JP); Satoshi Okabe, Tokyo (JP); Masahide Matsubara, Tokyo (JP); Kunio Yube, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 182 days.

(21) Appl. No.: 13/805,118

(22) PCT Filed: May 27, 2011

(86) PCT No.: PCT/JP2011/062218
§ 371 (c)(1),
(2), (4) Date: Dec. 18, 2012

(87) PCT Pub. No.: WO2011/158634
PCT Pub. Date: Dec. 22, 2011

(65) Prior Publication Data
US 2013/0105729 A1    May 2, 2013

(30) Foreign Application Priority Data

Jun. 18, 2010    (JP) .................................. 2010-139783

(51) Int. Cl.
  *C23F 1/10*    (2006.01)
  *C23F 1/14*    (2006.01)
  (Continued)

(52) U.S. Cl.
  CPC .................. *C23F 1/10* (2013.01); *C23F 1/14* (2013.01); *C23F 1/18* (2013.01); *C23F 1/26* (2013.01);
  (Continued)

(58) Field of Classification Search
  CPC ........ H01L 21/32134; C23F 1/18; C23F 1/34; C23F 1/14; C23F 1/38; C23F 1/10; C23F 1/00; C23F 1/26
  (Continued)

(56) References Cited

U.S. PATENT DOCUMENTS 5,496,590 A    3/1996 Maki et al.
5,807,493 A *  9/1998 Maki et al. .................... 216/106
(Continued)

FOREIGN PATENT DOCUMENTS

CN    1106849         8/1995
CN    1147025 A       4/1997
(Continued)

OTHER PUBLICATIONS

Kear, F., "Printed Circuit Assembly Manufacturing," Marcel Dekker, Inc., p. 140 (1987).
(Continued)

*Primary Examiner* — Duy Deo
*Assistant Examiner* — Erin Bergner
(74) *Attorney, Agent, or Firm* — Oblon, McClelland, Maier & Neustadt, L.L.P.

(57) ABSTRACT

The present invention relates to an etching solution for a multilayer thin film containing a copper layer and a molybdenum layer, and a method of etching a multilayer thin film containing a copper layer and a molybdenum layer using the etching solution. There are provided an etching solution for a multilayer thin film containing a copper layer and a molybdenum layer, including (A) an organic acid ion supply source containing two or more carboxyl groups and one or more hydroxyl groups in a molecule thereof, (B) a copper ion supply source and (C) an ammonia and/or ammonium
(Continued)

ion supply source, the etching solution having a pH value of from 5 to 8, and an etching method using the etching solution.

17 Claims, 1 Drawing Sheet

(51) Int. Cl.

| | | |
|---|---|---|
| C23F 1/18 | (2006.01) | |
| C23F 1/26 | (2006.01) | |
| C23F 1/34 | (2006.01) | |
| C23F 1/38 | (2006.01) | |
| H01L 21/3213 | (2006.01) | |

(52) U.S. Cl.
CPC .................. C23F 1/34 (2013.01); C23F 1/38 (2013.01); H01L 21/32134 (2013.01)

(58) Field of Classification Search
USPC ................ 106/1.05, 1.23; 174/389; 204/223; 205/164, 184, 220; 216/106, 13, 17, 20, 216/41, 83, 88, 93, 96; 252/79.1, 79.2, 252/79.4; 422/420; 428/336, 613, 626; 430/329; 438/613, 614, 689, 692, 702, 438/745; 510/175
See application file for complete search history.

(56) References Cited

U.S. PATENT DOCUMENTS

| | | | |
|---|---|---|---|
| 6,426,020 B1 * | 7/2002 | Okada et al. | ................ 252/79.1 |
| 7,008,548 B2 | 3/2006 | Chae et al. | |
| 2002/0076930 A1 | 6/2002 | Jo et al. | |
| 2003/0070933 A1 * | 4/2003 | Crotty | ........................ 205/253 |
| 2004/0118814 A1 | 6/2004 | Kim et al. | |
| 2008/0286974 A1 | 11/2008 | Kim et al. | |

FOREIGN PATENT DOCUMENTS

| | | |
|---|---|---|
| CN | 1210886 A | 3/1999 |
| CN | 1423172 A | 6/2003 |
| CN | 101418449 A | 4/2009 |
| JP | 60 243286 | 12/1985 |
| JP | 2001 200380 | 7/2001 |
| JP | 2002 241968 | 8/2002 |
| JP | 2002 302780 | 10/2002 |
| JP | 2004 193620 | 7/2004 |
| JP | 2008 288575 | 11/2008 |
| WO | 2009 038063 | 3/2009 |

OTHER PUBLICATIONS

Zashchita Metallov, "Protection of Metals," vol. 23 No. 1, pp. 295 to 297, (Jan.-Feb. 1987).
International Search Report Issued Aug. 30, 2011 in PCT/JP11/62218 Filed May 27, 2011.
Office Action issued on Apr. 3, 2014 in the corresponding China Patent Application No. 201180030089.0.
Office Action issued in corresponding Taiwan Patent Application No. 10420172800, dated Feb. 9, 2015.

* cited by examiner

ETCHING LIQUID FOR FILM OF MULTILAYER STRUCTURE CONTAINING COPPER LAYER AND MOLYBDENUM LAYER

This application is a 371 of PCT/JP11/62218, filed May 27, 2011. Priority to Japanese patent application 2010-139783, filed Jun. 18, 2010, is claimed.

TECHNICAL FIELD

The present invention relates to etching solutions for multilayer films containing a copper layer and a molybdenum layer and an etching method using the etching solutions. In particular, the etching solutions according to the present invention can be suitably used for etching a multilayer thin film containing a molybdenum layer and a copper layer formed on the molybdenum layer.

BACKGROUND ART

Hitherto, as wiring materials for display devices such as flat panel displays, there have been generally used aluminum and aluminum alloys. However, with the recent increase in size and resolution of the displays, the aluminum-based wiring materials tend to suffer from problems such as signal delay owing to their properties such as a wiring resistance, and therefore tend to hardly provide a uniform image display.

In consequence, studies have been made to provide wirings formed of a lower-resistance material such as copper and a material containing cooper as a main component. However, copper is advantageous in its low resistance, but has problems such as poor adhesion to a substrate such as a glass substrate when used in gate wirings and occurrence of undesirable diffusion to an underlying silicon semiconductor film when used in source/drain wirings. In order to avoid these problems, there have been made studies on lamination of a barrier film containing a metal having a barrier property capable of preventing diffusion of copper, etc., to the silicon semiconductor film. As the metal used in the barrier film, titanium (Ti) and molybdenum (Mo) have been studied, and a multilayer thin film using copper in combination with these metals has been proposed.

The multilayer thin film containing copper or a copper alloy containing copper as a main component is formed on a substrate such as a glass substrate by a film-forming process such as sputtering. Then, after masking a resist applied onto the multilayer thin film or the like, the film is subjected to an etching step to form an electrode pattern thereon. The etching step may be conducted either by a wet method using an etching solution or by a dry method using an etching gas such as plasma. The etching solution used in the wet method is required to provide (i) a high processing accuracy, (ii) a less amount of etching residues, (iii) a high stability or safety of its components with easiness of handling, (iv) a stable etching performance, etc.

As the etching solutions conventionally used for etching the multilayer thin film containing copper or a copper alloy containing copper as a main component, there are known an etching solution containing at least one substance selected from the group consisting of hydrogen peroxide, a neutral salt, an inorganic acid and an organic acid (refer to Patent Document 1), an etching solution containing hydrogen peroxide, a carboxylic acid and fluorine (refer to Patent Document 2), an etching solution containing hydrogen peroxide, an organic acid, a phosphoric acid salt, a nitrogen-containing first additive, a second additive and a fluorine compound (refer to Patent Document 3), an etching solution containing hydrogen peroxide, a fluorine ion supply source, a sulfuric acid salt, a phosphoric acid salt and an azole-based compound (refer to Patent Document 4) or the like.

However, these etching solutions containing hydrogen peroxide have problems such as (i) large change in etching rate owing to change in concentration of hydrogen peroxide, (ii) generation of gases and heat owing to abrupt decomposition of hydrogen peroxide which tends to cause a risk of breakage of facilities, or the like. For these reasons, there is an increasing demand for an etching solution containing no hydrogen peroxide.

On the other hand, as the etching solution containing no hydrogen peroxide, there are known ammoniacally alkaline etching solutions containing a copper (II) ion and ammonia (for example, refer to Patent Document 5 and Non-Patent Documents 1 and 2). Even these ammoniacally alkaline etching solutions are capable of etching a multilayer thin film containing copper or a copper alloy containing copper as a main component such as copper/molybdenum-based multilayer films. However, the etching solutions tend to suffer from volatilization of a large amount of ammonia therefrom owing to a high pH value of the solutions and therefore reduction in ammonia concentration in the solutions. As a result, there tend to occur variation in etching rate and considerable deterioration in working environments. In addition, the high pH value of the etching solutions tends to pose such a problem that a resist is dissolved in the solutions. In this case, volatilization of ammonia from the etching solutions may be suppressed by adjusting the pH value thereof to a neutral range. However, the neutral etching solutions have problems such as deposition of residues upon rinsing with water after etched.

PRIOR ART DOCUMENTS

Patent Documents

Patent Document 1: JP 2002-302780A
Patent Document 2: U.S. Pat. No. 7,008,548
Patent Document 3: JP 2004-193620A
Patent Document 4: JP 2008-288575A
Patent Document 5: JP 60-243286A Non-Patent Documents Non-Patent Document 1: Fred W. Kear, "PRINTED CIRCUIT ASSEMBLY MANUFACTURING", MARCEL DEKKER, INC., p. 140, 1987
Non-Patent Document 2: "ZASHCHITA METALLOV" (1987), Vol. 23 (2), pp. 295-297

DISCLOSURE OF THE INVENTION

Figure 1:
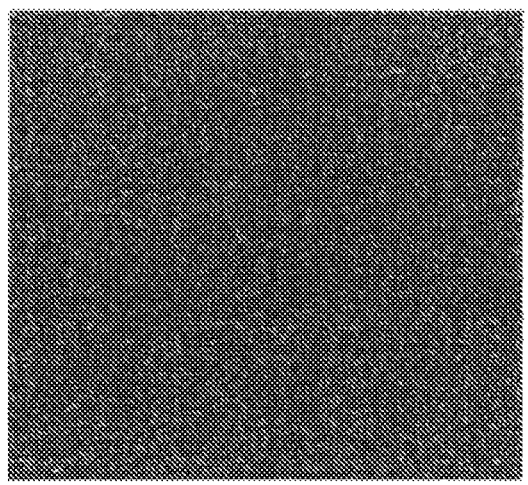
FIG. 1 is a SEM micrograph of a surface of a glass substrate after etched in Example 1.

Problems to be Solved by the Invention

The present invention has been accomplished under the above circumstances. An object of the present invention is to provide an etching solution for a multilayer thin film including a copper layer and a molybdenum layer, and a method of etching a multilayer thin film including a copper layer and a molybdenum layer using the etching solution.

Means for Solving the Problems

As a result of an earnest study for achieving the above object, the present inventors have found that the above object of the present invention can be achieved by using an etching solution prepared by compounding (A) an organic acid ion supply source containing two or more carboxyl groups and one or more hydroxyl groups in a molecule thereof, (B) a copper ion supply source and (C) an ammonia and/or ammonium ion supply source with each other whose pH value is adjusted to a range of from 5 to 8.

The present invention has been accomplished on the basis of the above finding. That is, the present invention provides the following aspects:

[1] An etching solution for a multilayer thin film containing a copper layer and a molybdenum layer, including (A) an organic acid ion supply source containing two or more carboxyl groups and one or more hydroxyl groups in a molecule thereof, (B) a copper ion supply source and (C) an ammonia and/or ammonium ion supply source, the etching solution having a pH value of from 5 to 8.

[2] The etching solution as described in the above aspect [1], wherein the organic acid ion supply source (A) containing two or more carboxyl groups and one or more hydroxyl groups in a molecule thereof is at least one substance selected from the group consisting of citric acid, tartaric acid, malic acid and ammonium salts of these acids.

[3] The etching solution as described in the above aspect [1] or [2], wherein a compounding ratio (molar ratio) of the organic acid ion supply source (A) containing two or more carboxyl groups and one or more hydroxyl groups in a molecule thereof to the copper ion supply source (B) is from 0.2 to 3.0.

[4] The etching solution as described in any one of the above aspects [1] to [3], wherein the copper ion supply source (B) is at least one substrate selected from the group consisting of copper, copper sulfate and copper nitrate.

[5] The etching solution as described in any one of the above aspects [1] to [4], wherein the ammonia and/or ammonium ion supply source (C) is at least one substrate selected from the group consisting of ammonia, ammonium sulfate, ammonium nitrate, ammonium citrate, ammonium tartarate and ammonium malate.

[6] A method of etching a multilayer thin film containing a copper layer and a molybdenum layer, comprising the step of contacting an object to be etched with the etching solution as described in any one of the above aspects [1] to [5].

[7] The method as described in the above aspect [6], wherein the multilayer thin film comprises the molybdenum layer and the copper layer laminated on the molybdenum layer.

Effect of the Invention

According to the present invention, it is possible to provide an etching solution which is adaptable to increase in size and resolution of displays without occurrence of etching residues and deposits in the step of etching a multilayer thin film containing a copper layer and a molybdenum layer, and a method of etching a multilayer thin film containing a copper layer and a molybdenum layer using the etching solution. Also, the etching solution of the present invention is capable of etching the multilayer thin film containing a copper layer and a molybdenum layer as a whole at once so that wirings can be produced thereon with a high productivity. In addition, the etching solution of the present invention has a pH value of from 5 to 8 being in a neutral range so that volatilization of ammonia therefrom can be suppressed, and therefore the etching solution has an excellent stability and exhibits easiness in handling.

PREFERRED EMBODIMENTS FOR CARRYING OUT THE INVENTION

Etching Solution for Multilayer Thin Film Containing Copper Layer and Molybdenum Layer The etching solution of the present invention is used for etching a multilayer thin film containing a copper layer and a molybdenum layer, and includes (A) an organic acid ion supply source containing two or more carboxyl groups and one or more hydroxyl groups in a molecule thereof, (B) a copper ion supply source and (C) an ammonia and/or ammonium ion supply source in which a pH value of the etching solution is in the range of from 5 to 8.

<<(A) Organic Acid Ion Supply Source>>

The organic acid ion supply source (A) used in the etching solution of the present invention (hereinafter occasionally referred to merely as a "component (A)") has an organic acid structure containing two or more carboxyl groups and one or more hydroxyl groups in a molecule thereof. The organic acid ion supply source (A) serves for suppressing occurrence of residues and deposits on a substrate upon rinsing the substrate with water after etched. Examples of the preferred organic acid ion supply source (A) include monohydroxydicarboxylic acids such as malic acid, tartaric acid and citramalic acid; monohydroxytricarboxylic acids such as citric acid and isocitric acid; hydroxysaccharic acids such as gulucaric acid and galactaric acid; and organic acids such as hydroxyamine carboxylic acids. These organic acid ion supply sources may be used alone or in the form of a mixture of any two or more thereof. Among these organic acid ion supply sources, from the viewpoints of attaining a stable solubility in the etching solution and suppressing occurrence of residues and deposits on the substrate, preferred are monohydroxydicarboxylic acids and monohydroxytricarboxylic acids, and more preferred are citric acid, malic acid and tartaric acid.

Also, as the preferred component (A), there may be mentioned ammonium salts of the above organic acids such as ammonium citrate, ammonium malate and ammonium tartarate. Meanwhile, the ammonium salts of these organic acids may function not only as the component (A) but also as the below-mentioned component (C).

<<(B) Copper Ion Supply Source>>

The copper ion supply source (B) used in the etching solution of the present invention (hereinafter occasionally referred to merely as a "component (B)") is not particularly limited, and any copper compounds may be used in the present invention as long as they are capable of supplying a copper (II) ion. In order to achieve a good etching rate, as the copper ion supply source (B), there may be suitably used not only copper but also copper salts such as copper sulfate, copper nitrate, copper acetate, cupric chloride, cupric bromide, cupric fluoride and cupric iodide. These copper ion supply sources may be used alone or in combination of any two or more thereof. Further, there may also be used copper salt of the above organic ion supply source (A) such as copper citrate, copper tartarate and copper malate. Among these copper ion supply sources, preferred are copper, copper sulfate and copper nitrate, and especially preferred are copper sulfate and copper nitrate. Meanwhile, the copper salts of the above organic ion supply source (A) may also function as the component (A) while exhibiting a function as the component (B).

<<(C) Ammonia and/or Ammonium Ion Supply Source>>

The ammonia and/or ammonium ion supply source (C) used in the etching solution of the present invention (hereinafter occasionally referred to merely as a "component (C)") is not particularly limited, and any ammonia or ammonium salts may be used in the present invention as long as they are capable of supplying ammonia and/or an ammonium ion.

Examples of the preferred ammonium salts include ammonium sulfate, ammonium nitrate, ammonium carbonate, ammonium chloride and ammonium acetate, as well as the above-mentioned ammonium salts of the organic acid ion supply source (A) such as ammonium citrate, ammonium tartarate and ammonium malate. These ammonia and/or ammonium ion supply sources may be used alone or in combination of any two or more thereof. Among these ammonia and/or ammonium ion supply sources, preferred are ammonia, ammonium sulfate, ammonium nitrate, ammonium citrate, ammonium tartarate and ammonium malate. Meanwhile, the ammonium salts of the above organic acid ion supply source (A) may also function as the component (A) while exhibiting a function as the component (C).

<<Composition of Etching Solution>>

The amount of the organic acid ion supply source compounded in the etching solution of the present invention is either an amount of the component (A), or a total amount of the component (A), and the component (B) and/or the component (C) when the component (B) is a copper salt of the organic acid ion supply source (A) and/or the component (C) is an ammonium salt of the organic acid ion supply source (A). The amount of the organic acid ion supply source compounded is controlled such that a compounding ratio (molar ratio) of the organic acid ion supply source to the copper ion supply source (B) is preferably from 0.2 to 3.0 and more preferably from 0.4 to 1.5. When the content of the organic acid ion supply source in the etching solution of the present invention lies within the above-specified range, it is possible to effectively suppress occurrence of residues or deposits on the substrate and attain a good etching rate.

The amount of the copper ion supply source (B) compounded in the etching solution of the present invention is preferably in the range of from 0.2 to 1 mol/kg-etching solution, and more preferably from 0.3 to 0.8 mol/kg-etching solution. When the amount of the component (B) compounded in the etching solution lies within the above-specified range, it is possible to attain a good etching rate and therefore readily control an amount of the material to be etched.

The amount of the ammonia and/or ammonium ion supply source (C) compounded in the etching solution of the present invention is preferably in the range of from 0.5 to 10 mol/kg-etching solution, more preferably from 1 to 5 mol/kg-etching solution and still more preferably from 1.5 to 4 mol/kg-etching solution. When the amount of the component (C) compounded in the etching solution lies within the above-specified range, it is possible to attain a good etching rate and a good etching performance.

<<(D) pH Controlling Agent>>

The etching solution of the present invention may also contain (D) a pH controlling agent, if required, in order to well control a pH value of the etching solution. The pH controlling agent (D) is not particularly limited unless it gives any adverse influence on the effects of the etching solution. Examples of the preferred pH controlling agent (D) include ammonia, metal hydroxides such as sodium hydroxide and potassium hydroxide, amine salts such as monoethanol amine, diethanol amine and triethanol amine, and inorganic acids such as hydrochloric acid, sulfuric acid and nitric acid. Among these pH controlling agents, preferred are ammonia, potassium hydroxide and sulfuric acid.

The amount of the pH controlling agent (D) compounded in the etching solution of the present invention may be an amount capable of adjusting a pH value of the etching solution to a range of from 5 to 8, and therefore may be determined according to the other components contained in the etching solution.

<<pH>>

The pH value of the etching solution of the present invention is required to lie within the range of from 5 to 8, and is preferably from 6 to 8. When the pH value of the etching solution is less than 6, the etching rate tends to be excessively low. On the other hand, when the pH value of the etching solution is more than 8, there tends to occur volatilization of ammonia from the etching solution, which tends to result in considerable deterioration in stability of the etching solution and working environments.

<<Other Components>>

The etching solution of the present invention may contain, in addition to the above components (A) to (C) and the above pH controlling agent (D) as an optional component, water and various other additives ordinarily used in etching solutions unless addition of these materials gives any adverse influence on the effects of the etching solution. The water added is preferably previously subjected to distillation, ion exchange treatment, filter treatment or various adsorption treatments to remove metal ions, organic impurities and particles therefrom. In particular, pure water or ultrapure water is preferably used in the present invention.

[Method of Etching Multilayer Thin Film Containing Copper Layer and Molybdenum Layer]

The etching method of the present invention is a method of etching a multilayer thin film containing a copper layer and a molybdenum layer. The etching method of the present invention is characterized by using the etching solution of the present invention, i.e., an etching solution for a copper/molybdenum-based multilayer thin film which is prepared by compounding the organic acid ion supply source (A) containing two or more carboxyl groups and one or more hydroxyl groups in a molecule thereof, the copper ion supply source (B) and the ammonia and/or ammonium ion supply source (C) with each other, and has a pH value of from 5 to 8. The etching method of the present invention includes the step of contacting an object to be etched with the etching solution of the present invention. According to the etching method of the present invention, it is possible to etch the multilayer thin film containing a copper layer and a molybdenum layer as a whole at once without occurrence of etching residues or deposits.

In the etching method of the present invention, as the object to be etched with the etching solution of the present invention, there may be used, for example, such a member obtained by sequentially laminating a barrier film (molybdenum layer) formed of a molybdenum-based material and a copper wiring (copper layer) formed of copper or a material containing copper as a main component on a substrate such as a glass substrate to prepare a multilayer thin film containing the copper layer and the molybdenum layer thereon, further applying a resist onto the copper wiring, exposing the resist to light to transfer a desired mask pattern thereonto, and then developing the thus exposed resist to form a desired resist pattern. In the present invention, the multilayer thin film containing the copper layer and the molybdenum layer may include not only a configuration in which the copper layer is laminated on the molybdenum layer as shown in FIG. 1, but also a configuration in which the molybdenum layer is laminated on the copper layer. In the etching method of the present invention, the object to be etched preferably has the configuration in which the copper layer is laminated on the molybdenum layer as shown in FIG. 1 from the viewpoint of effectively exhibiting a performance of the etching solution of the present invention. The above multilayer thin film containing the copper layer and the molybdenum layer may be suitably used in wiring of display devices such as flat panel displays. Therefore, from the viewpoint of such an application field of the multilayer thin film, it is preferred that the object to be etched has the configuration in which the copper layer is laminated on the molybdenum layer.

The copper wiring is not particularly limited as long as the copper wiring is formed of copper or a material containing copper as a main component. Examples of the molybdenum-based material forming the barrier film include metallic molybdenum (Mo), a nitride of molybdenum (MoN) and Mo-based alloys.

The method of contacting the object to be etched with the etching solution is not particularly limited. As the contacting method, there may be used, for example, wet etching methods such as a method of adding dropwise the etching solution (sheet spinning treatment) or spraying the etching solution onto the object to be etched, and a method of dipping the object to be etched in the etching solution. In the present invention, among these methods, there are preferably used the method of adding dropwise the etching solution to the object to be etched (sheet spinning treatment) and the method of spraying the etching solution onto the object to be etched.

The etching solution used in the above method preferably has a temperature of from 10 to 70° C. and especially preferably a temperature of from 20 to 50° C. When the temperature of the etching solution is 10° C. or higher, it is possible to attain a good etching rate and therefore an excellent production efficiency. On the other hand, when the temperature of the etching solution is 70° C. or lower, the etching solution can be prevented from suffering from significant change in composition thereof, so that the etching performances can be kept constant. The higher the temperature of the etching solution, the higher the etching rate becomes. However, in view of suppressing significant change in composition of the etching solution, the etching solution may be appropriately controlled to any optimum treating temperature.

EXAMPLES

The present invention will be described in more detail below by referring to the following examples. It should be noted, however, that the following examples are only illustrative and not intended to limit the invention thereto.
(Evaluation of Residues on Multilayer Thin Film Containing Copper Layer and Molybdenum Layer after Subjected to Etching)

The surface of each of the multilayer thin film specimens containing a copper layer and a molybdenum layer obtained after being subjected to etching in the respective Examples and Comparative Examples was observed using a scanning electron microscope "S5000H Type (Model No.)" available from Hitachi Ltd., at a magnification of 20000 times (acceleration voltage: 2 kV; emission current: 10 μA). The resulting SEM image was analyzed to determine whether or not any residues or deposits were present on the surface of the respective specimens after the etching treatment and evaluate the results according to the following ratings.

◯: No residues nor deposits were recognized.

X: Residues or deposits were recognized.

Preparation Example

Preparation of a Multilayer Thin Film Containing a Copper Layer and a Molybdenum Layer Molybdenum was subjected to sputtering to form a barrier layer made of molybdenum (molybdenum film thickness: 200 Å) on a glass substrate, and then a material containing copper as a main component was also subjected to sputtering to form a wiring material layer (copper film thickness: about 5000 Å) on the barrier layer. A resist was applied over the wring material layer, and a pattern mask was placed on the resist layer. The resist layer was exposed to light to transfer the pattern thereonto. Then, the thus exposed resist layer was developed, and a multilayer thin film in which the patterned resist layer, a copper layer and a molybdenum layer are laminated in this order from above, was prepared.

Example 1

A 100-mL polypropylene container was charged with 15.64 g of copper sulfate pentahydrate (available from Wako Pure Chemical Industries, Ltd.) as the component (B) and 61.15 g of pure water. Further, 3 g of ammonium sulfate (available from Wako Pure Chemical Industries, Ltd.) as the component (C) and 7 g of citric acid as the component (A) were added to the container, followed by stirring the contents of the container. After confirming that the respective components of the container were dissolved, 13.21 g of an ammonia aqueous solution (concentration: 28% by mass; available from Mitsubishi Gas Chemical Company, Inc.) as the component (C) were added to the container, and the contents of the container were stirred again to prepare an etching solution. The resulting etching solution had such a composition that the amount of the component (A) compounded therein was 0.36 mol/kg-etching solution; a compounding ratio (molar ratio) of the organic acid ion supply source to the copper ion supply source (B) was 0.58; the amount of the component (B) compounded therein was 0.63 mol/kg-etching solution; and the amount of the component (C) compounded therein was a sum of the amount of the ammonium sulfate compounded (a double amount of 0.23 mol/kg-etching solution) and the amount of the ammonia aqueous solution compounded (2.2 mol/kg-etching solution), i.e., 2.7 mol/kg-etching solution.

The multilayer thin film containing the copper layer and the molybdenum layer obtained in the above Preparation Example was etched with the resulting etching solution at 35° C. for 300 s to thereby obtain an etched multilayer thin film specimen containing the copper layer and the molybdenum layer. The resulting specimen was evaluated by the above method. The evaluation results are shown in Table 1.

Examples 2 to 11 and 13 and Comparative Examples 1 to 5

The same procedure as in Example 1 was repeated except that the composition of the etching solution was changed as shown in Table 1, thereby obtaining etching solutions. Then, the etching treatment was carried out in the same manner as in Example 1 except for using the thus obtained etching solutions. The resulting specimens were evaluated by the above method. The evaluation results are shown in Table 1.

Example 12

The same procedure as in Example 1 was repeated except that no ammonium sulfate was compounded, sulfuric acid was added as a pH controlling agent, and the amounts of citric acid compounded as the component (A) and copper sulfate pentahydrate compounded as the component (B) were changed as shown in Table 1, thereby obtaining an etching solution. Then, the etching treatment was carried out in the same manner as in Example 1 except for using the thus obtained etching solution. The resulting specimen was evaluated by the above method. The evaluation results are shown in Table 1.

TABLE 1-1

| | Component (A) | | | Component (B) |
|---|---|---|---|---|
| | Kind | Amount compounded[*1] | Compounding ratio[*2] | Amount compounded[*1] |
| Example 1 | Citric acid | 0.36 | 0.58 | 0.63 |
| Example 2 | Citric acid | 0.26 | 0.42 | 0.63 |
| Example 3 | Citric acid | 0.52 | 0.83 | 0.63 |
| Example 4 | Citric acid | 0.86 | 1.38 | 0.63 |
| Example 5 | Tartaric acid | 0.43 | 0.69 | 0.63 |
| Example 6 | Tartaric acid | 0.67 | 1.06 | 0.63 |
| Example 7 | Tartaric acid | 0.86 | 1.37 | 0.63 |
| Example 8 | Malic acid | 0.75 | 1.19 | 0.63 |
| Example 9 | Citric acid | 0.36 | 0.58 | 0.63 |
| Example 10 | Citric acid | 0.36 | 0.58 | 0.63 |
| Example 11 | Citric acid | 0.36 | 0.58 | 0.63 |
| Example 12 | Citric acid | 0.36 | 0.58 | 0.63 |
| Example 13 | Citric acid | 0.36 | 0.58 | 0.63 |
| Example 14 | Citric acid | 1.56 | 2.49 | 0.63 |
| Example 15 | Citric acid | 0.36 | 0.58 | 0.63 |
| Example 16 | Triammonium citrate | 0.37 | 0.60 | 0.63 |
| Comparative Example 1 | — | 0 | 0 | 0.63 |
| Comparative Example 2 | — | 0 | 0 | 0.63 |
| Comparative Example 3 | Acetic acid | 1.67 | 2.66 | 0.63 |
| Comparative Example 4 | Maleic acid | 0.86 | 1.37 | 0.63 |
| Comparative Example 5 | Glycolic acid | 1.12 | 1.79 | 0.63 |
| Comparative Example 6 | Lactic acid | 1.11 | 1.77 | 0.63 |

TABLE 1-2

| | Component (C) | | | Component (D) | | | |
|---|---|---|---|---|---|---|---|
| | Amount compounded[*1, 3] | Amount compounded[*1, 4] | Total amount[*1] | Kind | Water | pH | Evaluation of residues |
| Example 1 | 0.46 | 2.2 | 2.7 | — | Balance | 7 | ○ |
| Example 2 | 0.46 | 2.0 | 2.5 | — | Balance | 7 | ○ |
| Example 3 | 0.46 | 2.6 | 3.1 | — | Balance | 7 | ○ |
| Example 4 | 0.46 | 3.4 | 3.9 | — | Balance | 7 | ○ |
| Example 5 | 0.46 | 2.3 | 2.8 | — | Balance | 7 | ○ |
| Example 6 | 0.46 | 1.9 | 2.4 | — | Balance | 7 | ○ |
| Example 7 | 0.46 | 2.5 | 3.0 | — | Balance | 7 | ○ |
| Example 8 | 0.46 | 2.5 | 3.0 | — | Balance | 7 | ○ |
| Example 9 | 0.46 | 1.7 | 2.2 | — | Balance | 5.5 | ○ |
| Example 10 | 0.46 | 1.9 | 2.4 | — | Balance | 6 | ○ |
| Example 11 | 0.46 | 2.0 | 2.5 | — | Balance | 6.5 | ○ |
| Example 12 | 0.46 | 2.2 | 2.7 | — | Balance | 7.5 | ○ |
| Example 13 | 0.46 | 2.6 | 3.1 | — | Balance | 8 | ○ |
| Example 14 | 0.46 | 6.3 | 6.8 | — | Balance | 7 | ○ |
| Example 15 | — | 2.9 | 2.9 | Sulfuric acid | Balance | 7 | ○ |
| Example 16 | 1.6 | 1.1 | 2.7 | — | Balance | 7 | ○ |
| Comparative Example 1 | 0.46 | 1.2 | 1.7 | — | Balance | 7 | — |
| Comparative Example 2 | 0.46 | 2.0 | 2.5 | — | Balance | 8 | X |
| Comparative Example 3 | 0.46 | 3.5 | 4.0 | — | Balance | 7 | X |
| Comparative Example 4 | 0.46 | 3.3 | 3.8 | — | Balance | 7 | X |
| Comparative Example 5 | 0.46 | 2.6 | 3.1 | — | Balance | 7 | X |
| Comparative Example 6 | 0.46 | 2.4 | 2.9 | — | Balance | 7 | X |

Note:
[*1]: Mol/kg-etching solution.
[*2]: Compounding ratio (molar ratio) of the organic acid ion supply source to the copper ion supply source (B).
[*3]: In Examples 1 to 11 and Comparative Examples 1 to 6, the amount compounded means a double of the amount of ammonium sulfate compounded (as an amount of ammonium compounded), whereas in Example 13, the amount compounded means a sum of a double amount of ammonium sulfate compounded (as an amount of ammonium compounded) and a triple amount of triammonium citrate (as an amount of ammonium compounded).
[*4]: Amount of ammonia compounded.

In the respective Examples in which the etching solutions of the present invention were used, no residues of copper hydroxide derived from the etching solution after subjected to etching were recognized, and the etching treatment was carried out with a good etching performance without any ammonia odor. On the other hand, among Comparative Examples 1 and 2 in which the etching solutions contained no organic acid ion supply source (A), in Comparative Example 1 in which a pH value of the etching solution was adjusted to 7, the respective components were not dissolved and therefore failed to prepare an etching solution for the evaluation, whereas in Comparative Example 2 in which a pH value of the etching solution was adjusted to 8, a considerable amount of residues (deposits) were produced. Further, in Comparative Examples 3 to 6 in which the organic acids other than the organic acid ion supply source (A) defined by the present invention were used, a considerable amount of residues (deposits) were also produced.

Figure 2:
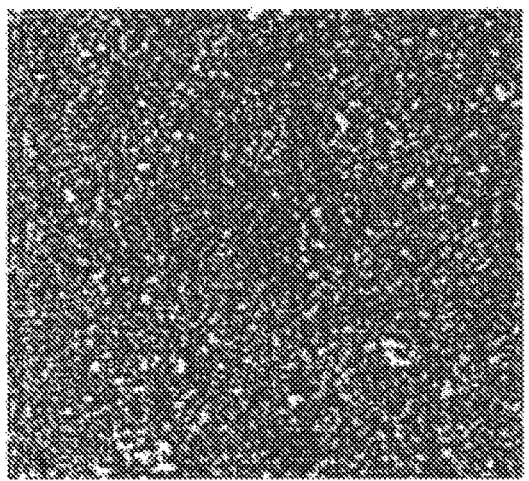
FIG. 2 is a SEM micrograph of a surface of a glass substrate after etched in Comparative Example 5.

In addition, as an example of SEM microphotographs showing surfaces of the respective specimens, the SEM microphotograph of the specimen obtained in Example 1 is shown in FIG. 1, and the SEM microphotograph of the specimen obtained in Comparative Example 5 is shown in FIG. 2. As recognized from these SEM images, when using the etching solution of the present invention, no residues were present on a surface of the glass substrate. On the other hand, when using the etching solution obtained in Comparative Example 5 in which no organic acid ion supply source (A) defined by the present invention was used, a considerable amount of residues (deposits) were present on a surface of the glass substrate.

INDUSTRIAL APPLICABILITY

The etching solution of the present invention can be suitably used for etching a multilayer thin film containing a copper layer and a molybdenum layer, in particular, a multilayer thin film in which the copper layer is laminated on the molybdenum layer. In the etching method using the etching solution of the present invention, it is possible to etch a wiring layer of the multilayer thin film containing the copper layer and the molybdenum layer as a whole at once without occurrence of etching residues, resulting in production of wiring with a high productivity.

The invention claimed is:
1. An etching solution, comprising:
(A) an organic acid ion supply source comprising two or more carboxyl groups and a hydroxyl group in a molecule thereof;
(B) a copper ion supply source; and
(C) at least one selected from the group consisting of an ammonia and ammonium ion supply source;
wherein the etching solution has a pH value of from 5 to 8,
the molar ratio of the organic acid ion supply source (A) to the copper ion supply source (B) is from 0.2 to 3.0,
the content of the copper ion supply source (B) in the etching solution is in a range of from 0.2 to 1 mol/kg-etching solution, and
the content of (C) in the etching solution is in a range of from 0.5 to 10 mol/kg-etching solution.
2. The etching solution of claim 1, wherein the organic acid ion supply source (A) is citric acid, tartaric acid, malic acid, an ammonium salt of citric acid, an ammonium salt of tartaric acid, an ammonium salt of malic acid, or any mixture thereof.

3. The etching solution claim 1, wherein the copper ion supply source (B) is copper, copper sulfate, copper nitrate, or any mixture thereof.
4. The etching solution of claim 1, wherein the at least one selected from ammonia and ammonium ion supply source (C) is selected from the group consisting of ammonia, ammonium sulfate, ammonium nitrate, ammonium citrate, ammonium tartarate, ammonium malate, or any mixture thereof.
5. A method of etching a multilayer thin film comprising a copper layer and a molybdenum layer, the method comprising:
contacting an object to be etched with the etching solution of claim 1.
6. The method of claim 5, wherein the multilayer thin film comprises the molybdenum layer and the copper layer laminated on the molybdenum layer.
7. The etching solution of claim 1, wherein the molar ratio of the organic acid ion supply source (A) to the copper ion supply source (B) is from 0.4 to 1.5.
8. The etching solution of claim 1, wherein the content of the copper ion supply source (B) in the etching solution is in a range of from 0.3 to 0.8 mol/kg-etching solution.
9. The etching solution of claim 1, wherein the content of the at least one selected from the group consisting of ammonia and ammonium ion supply source (C) in the etching solution is in a range of from 1.5 to 4 mol/kg-etching solution.
10. The etching solution of claim 1, further comprising:
a pH controlling agent (D), which is ammonia, potassium hydroxide, or sulfuric acid.
11. The etching solution of claim 1, having a pH value from 6 to 8.
12. The etching solution of claim 1, consisting essentially of water and:
(A) said organic acid ion supply source comprising two or more carboxyl groups and a hydroxyl group in a molecule thereof;
(B) said copper ion supply source;
(C) said at least one selected from the group consisting of ammonia and ammonium ion supply source; and
(D) a pH controlling agent.
13. The etching solution of claim 1, wherein
the etching solution comprises of from 0.26 to 1.56 mol of the organic acid ion supply source (A) per 1 kg of the etching solution,
a molar ratio of the organic acid ion supply source (A) to the copper ion supply source (B) is from 0.42 to 2.49, and
the etching solution comprises of from 2.2 to 6.8 mol of the at least one selected from the group consisting of ammonia and ammonium ion supply source (C) per 1 kg of the etching solution.
14. The etching solution of claim 2, wherein
the etching solution comprises of from 0.26 to 1.56 mol of the organic acid ion supply source (A) per 1 kg of the etching solution,
a molar ratio of the organic acid ion supply source (A) to the copper ion supply source (B) is from 0.42 to 2.49, and
the etching solution comprises of from 2.2 to 6.8 mol of the at least one selected from the group consisting of ammonia and ammonium ion supply source (C) per 1 kg of the etching solution.

15. The etching solution of claim 1, wherein
the etching solution comprises of from 0.26 to 0.86 mol of the organic acid ion supply source (A) per 1 kg of the etching solution,
a molar ratio of the organic acid ion supply source (A) to the copper ion supply source (B) is from 0.42 to 1.38, and
the etching solution comprises of from 2.2 to 3.1 mol of the at least one selected from the group consisting of ammonia and ammonium ion supply source (C) per 1 kg of the etching solution.

16. The etching solution of claim 2, wherein
the etching solution comprises of from 0.26 to 0.86 mol of the organic acid ion supply source (A) per 1 kg of the etching solution,
a molar ratio of the organic acid ion supply source (A) to the copper ion supply source (B) is from 0.42 to 1.38, and
the etching solution comprises of from 2.2 to 3.1 mol of the at least one selected from the group consisting of ammonia and ammonium ion supply source (C) per 1 kg of the etching solution.

17. The etching solution of claim 1, wherein
the organic acid ion supply source (A) is citric acid, tartaric acid, malic acid, an ammonium salt of citric acid, an ammonium salt of tartaric acid, an ammonium salt of malic acid, or any mixture thereof,
the copper ion supply source (B) is copper, copper sulfate, copper nitrate, or any mixture thereof, and
the at least one selected from ammonia and ammonium ion supply source (C) is selected from the group consisting of ammonia, ammonium sulfate, ammonium nitrate, ammonium citrate, ammonium tartarate, ammonium malate, or any mixture thereof.

* * * * *